United States Patent
Yang

(10) Patent No.: US 10,404,283 B2
(45) Date of Patent: Sep. 3, 2019

(54) METHOD AND ASSOCIATED DECODING CIRCUIT FOR DECODING AN ERROR CORRECTION CODE

(71) Applicant: Silicon Motion Inc., Hsinchu County (TW)

(72) Inventor: Tsung-Chieh Yang, Hsinchu (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 15/259,065

(22) Filed: Sep. 8, 2016

(65) Prior Publication Data

US 2017/0077962 A1 Mar. 16, 2017

(30) Foreign Application Priority Data

Sep. 10, 2015 (TW) .............................. 104129917 A

(51) Int. Cl.
| | |
|---|---|
| *H03M 13/37* | (2006.01) |
| *H03M 13/09* | (2006.01) |
| *H03M 13/15* | (2006.01) |
| *H03M 13/00* | (2006.01) |

(52) U.S. Cl.
CPC ..... *H03M 13/1545* (2013.01); *H03M 13/159* (2013.01); *H03M 13/1525* (2013.01); *H03M 13/6502* (2013.01)

(58) Field of Classification Search
None
See application file for complete search history.

(56) References Cited

U.S. PATENT DOCUMENTS

| | | | |
|---|---|---|---|
| 6,643,819 B1 | 11/2003 | Weng | |
| 8,370,727 B2 * | 2/2013 | Yang | ................... H03M 13/152 |
| | | | 714/781 |
| 8,418,028 B2 | 4/2013 | Yamaga | |
| 8,719,669 B2 | 5/2014 | Kong | |
| 8,739,007 B2 | 5/2014 | Anholt | |
| 9,246,515 B2 * | 1/2016 | Kong | ................ H03M 13/1515 |

(Continued)

FOREIGN PATENT DOCUMENTS

| | | |
|---|---|---|
| CN | 101795140 A | 8/2010 |
| CN | 102567134 A | 7/2012 |

(Continued)

*Primary Examiner* — Justin R Knapp
(74) *Attorney, Agent, or Firm* — Winston Hsu

(57) ABSTRACT

A method for decoding an error correction code and an associated decoding circuit are provided, where the method includes the steps of: calculating a set of error syndromes of the error correction code, where the error correction code is a t-error correcting code and has capability of correcting t errors, and a number s of the set of error syndromes is smaller than t; sequentially determining a set of coefficients within a plurality of coefficients of an error locator polynomial of the error correction code according to at least one portion of error syndromes within the set of error syndromes for building a roughly-estimated error locator polynomial; performing a Chien search to determine a plurality of roots of the roughly-estimated error locator polynomial; and performing at least one check operation to selectively utilize a correction result of the error correction code as a decoding result of the error correction code.

23 Claims, 6 Drawing Sheets

(56) References Cited

U.S. PATENT DOCUMENTS

| | | | |
|---|---|---|---|
| 9,298,546 B2 | 3/2016 | Kanno | |
| 2003/0046637 A1 | 3/2003 | Zhang | |
| 2004/0030984 A1 | 2/2004 | Renaud | |
| 2006/0107190 A1 | 5/2006 | Zhang | |
| 2012/0144261 A1* | 6/2012 | Hong | G06F 11/1048 714/755 |
| 2013/0326315 A1* | 12/2013 | Elia | G06F 7/724 714/785 |
| 2016/0359502 A1* | 12/2016 | Lin | H03M 13/152 |

FOREIGN PATENT DOCUMENTS

| | | |
|---|---|---|
| KR | 1020110107273 A | 9/2011 |
| KR | 1020120110450 A | 10/2012 |
| KR | 1020140018095 A | 2/2014 |
| KR | 1020140091087 A | 7/2014 |
| TW | 201031127 A1 | 8/2010 |
| TW | 201102807 A1 | 1/2011 |

* cited by examiner

METHOD AND ASSOCIATED DECODING CIRCUIT FOR DECODING AN ERROR CORRECTION CODE

BACKGROUND OF THE INVENTION

1. Field of the Invention

The present invention relates to the control of an error correction process, and more particularly, to a method and associated decoding circuit for decoding an error correction code.

2. Description of the Prior Art

An error correction code can be used to correct data errors. In a conventional communications system, data is usually encoded as an error correction code before being transmitted by a transmitting device. A receiving device within the communications system may receive and decode the error correction code in order to correct any data errors recovered. In another example, before a conventional data storage system stores data into a storage medium, the data is usually encoded as an error correction code, wherein when the data stored in the storage medium is partially damaged, the data storage system may decode the error correction code to recover the original data. Examples of the error correction code may comprise (but are not limited to): Bose, Ray-Chaudhuri, Hocquenghem (BCH) and Reed-Solomon (RS) codes. The BCH code is mostly applied to error correction in flash memories, and the RS code is mostly applied to error correction in optical storage mediums.

When a conventional data storage system reads data from the storage medium, since the data is stored using a set of error correction codes, the data storage system must decode the set of error correction codes to recover the original data. U.S. Pat. No. 8,370,727 proposed an error correction method. As the capacity of storage devices (e.g. memory cards conforming to SD/MMC, CF, MS, XD specifications) becomes larger, a terminal user can utilize such storage devices to access data of large size. There is therefore a need to provide better error correction efficiency for various types of storage devices, such as portable storage devices, in order to improve the user experience.

SUMMARY OF THE INVENTION

An objective of the present invention is to provide a method and an associated decoding circuit for decoding an error correction code, which can improve the efficiency of error correction.

Another objective of the present invention is to provide a method and an associated decoding circuit for decoding an error correction code, which can reduce the power consumption of a memory controller performing error correction.

At least one preferred embodiment of the present invention provides a method for decoding an error correction code. The method comprises: calculating a set of error syndromes of the error correction code, wherein the error correction code is a t-error correcting code and has capability of correcting t errors, and a number s of the set of error syndromes is smaller than t; sequentially determining a set of coefficients within a plurality of coefficients of an error locator polynomial of the error correction code according to at least one portion of error syndromes within the set of error syndromes, for building a roughly-estimated error locator polynomial, wherein the number of the plurality of coefficients is equal to t, and the number of the set of coefficients is equal to s; performing a Chien search to determine a plurality of roots of the roughly-estimated error locator polynomial; correcting the error correction code according to the roughly-estimated error locator polynomial in order to generate an correction result of the error correction code; and performing at least one check operation to selectively utilize the correction result as a decoding result of the error correction code.

In addition to the above decoding circuit, the present invention also provides a decoding circuit for decoding an error correction code. The decoding circuit comprises an error syndrome calculation module, an error locator polynomial determining module, a Chien search module, a checking module and a control module. The error syndrome calculation module is arranged to calculate a set of error syndromes of the error correction code, wherein the error correction code is a t-error correction code and has capability of correcting t errors, and a number s of the set of error syndromes is smaller than t. The error locator polynomial determining module is arranged to refer to at least one portion of error syndromes within the set of error syndromes, to sequentially determine a set of coefficients within a plurality of coefficients in an error locator polynomial of the error correction code, for building a roughly-estimated error locator polynomial, wherein the number of the plurality of coefficients is equal to t, and the number of the set of coefficients is equal to s. The Chien search module is arranged to execute a Chien search to find a plurality of roots of the roughly-estimated error locator polynomial. The error correction module is arranged to refer to the roots of the roughly-estimated error locator polynomial to correct the error correction code, in order to generate a correction result of the error correction code. The checking module is arranged to perform at least one checking operation upon the correction result of the error correction code, to generate at least one checking result. The control module is arranged to control operations of the decoding circuit, wherein under the control of the control module, the decoding circuit refers to the checking result of the checking operation, to selectively utilize the correction result as a decoding result of the error correction code.

In addition to the above decoding circuit, the present invention also provides a memory controller which comprises the aforementioned decoding circuit.

In addition to the above decoding circuit, the present invention also provides a storage device which comprises the aforementioned decoding circuit.

In addition to the above decoding circuit, the present invention also provides a controller of an electronic device, wherein the controller comprises the aforementioned decoding circuit.

Compared with data processing methods of the related art, the method and associated decoding circuit of the present invention may greatly improve the efficiency of error correction. Further, the method and associated decoding circuit of the present invention may greatly reduce the power consumption of a memory controller performing error correction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
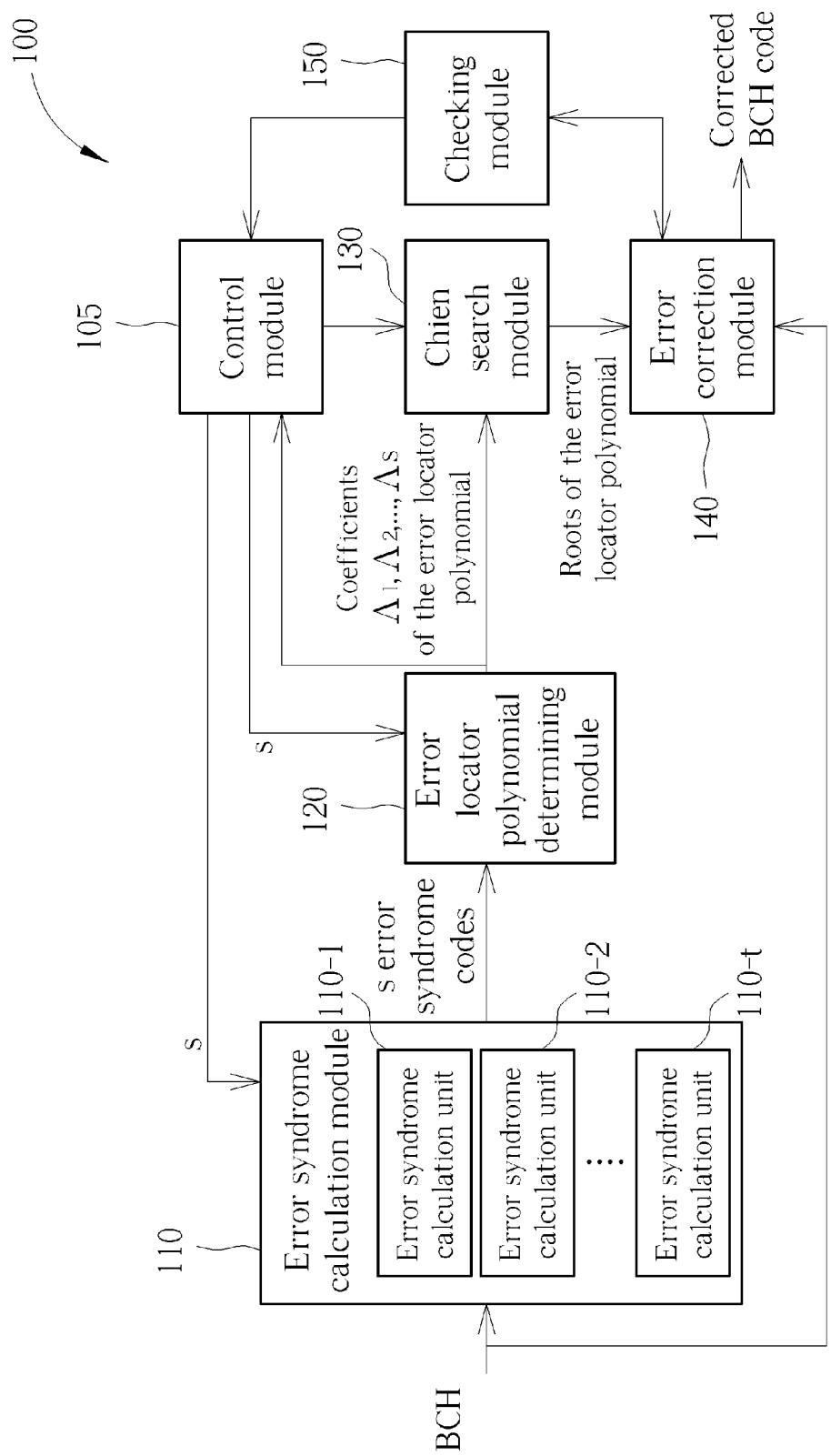
FIG. 1 is a diagram illustrating a decoding circuit for decoding an error correction code according to an embodiment of the present invention.

FIG. 1 is a diagram illustrating a decoding circuit 100 for decoding an error correction code according to an embodiment of the present invention. The error correction code may comprise a set of message bits and a set of parity bits; however, this is merely for illustrative purposes, and not meant to be a limitation of the present invention.

As shown in FIG. 1, the decoding circuit 100 may comprise a control module 105, an error syndrome calculation module 110, an error locator polynomial determining module 120, a Chien search module 130, an error correction module 140, and a checking module 150, wherein the error syndrome calculation module 110 may comprise a plurality of error syndrome calculation units, such as the t error syndrome calculation units 110-1, 110-2, ..., and 110-t. According to this embodiment, the control module 105 may be arranged to control operations of the decoding circuit 100. Specifically, the control module 105 may selectively control a number s of enabled error syndrome calculation units 110-1, 110-2, ..., and 110-s within the t error syndrome calculation units 110-1, 110-2, ..., and 110-t, wherein s, t are both positive integers, and s is smaller than t. Further, the control module 105 may selectively control the times s of the error locator polynomial determining module 120 executing the error correction code in a corresponding work flow, wherein the error locator polynomial determining module 120 performs loop calculation upon the error correction code for s times in the corresponding work flow.

Based on the scheme shown in FIG. 1, the control module 105 may selectively turn on at least one portion (e.g. part or all) of the error syndrome calculation units in the error syndrome calculation module 110, and may correspondingly control execution times of the error locator polynomial determining module 120. For example, the control module 105 may selectively turn on the error syndrome calculation units 110-1, 110-2, ..., and 110-s, wherein the number s of the error syndrome calculation units 110-1, 110-2, ..., and 110-s may be less than the number t of the error syndrome calculation units 110-1, 110-2, ..., and 110-t. In another example, when the control module 105 selectively turns on a portion of the error syndrome calculation units, such as the error syndrome calculation units 110-1, 110-2, ..., and 110-s, the control module 105 may correspondingly control execution times of the error locator polynomial determining module 120, rather than allowing the error locator polynomial determining module 120 to continuously execute the codeword until the maximum times t for one single codeword is achieved. Hence, the error locator polynomial determining module 120 may process a specific message (e.g. a specific codeword) ahead of schedule, and then immediately process a next message (e.g. a next codeword). When the Chien search module 130 is processing the specific message (e.g. the specific codeword), the error locator polynomial determining module 120 has already begun processing a next message (e.g. a next codeword). Therefore, under the control of the control module 105, the decoding circuit 100 may save time and reduce power consumptions. In addition, the overall efficiency of the electronic device having the decoding circuit 100 can be improved.

Under the control of the control module 105, the decoding circuit 100 may perform decoding again when taking some decoding errors into consideration. More particularly, the decoding circuit 100 may temporarily set the aforementioned number s to be equal to the aforementioned number t, in order to obtain a correct decoding result. Since errors are unlikely to occur in normal situations, as long as the control parameters of the error correction code are properly designed, the overall decoding efficiency of the decoding circuit 100 for all data may be improved without introducing side effects. Although performing the decoding operation again will inevitably waste time, the improved overall efficiency of the electronic device having the decoding circuit 100 may compensate for the sacrifice.

In practice, the error correction code may be a Bose, Ray-Chaudhuri, and Hocquenghem (BCH) code. According to some embodiments of the present invention, however, the error correction code may be the Reed-Solomon (RS) code.

Figure 2:
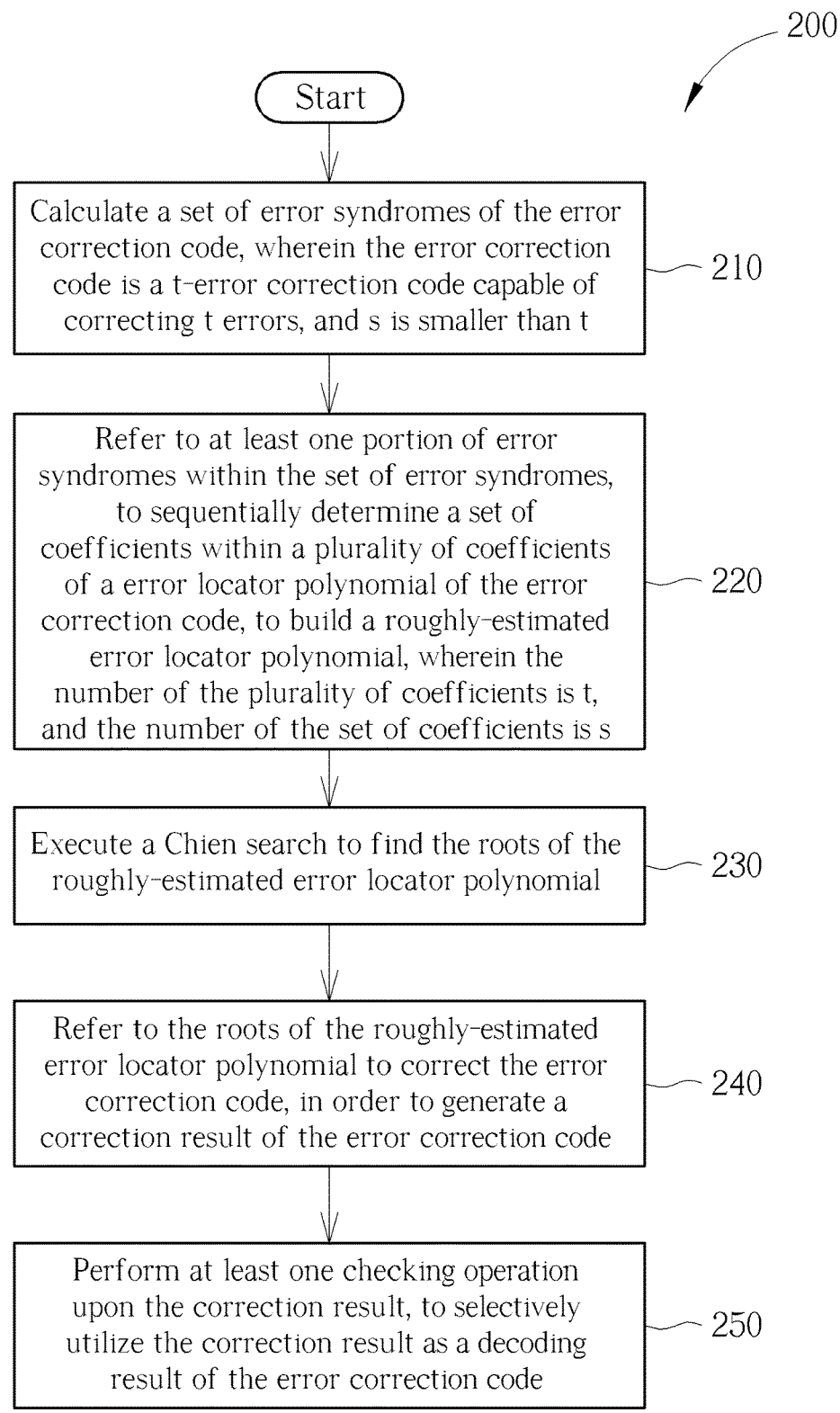
FIG. 2 is a work flowchart illustrating a method for decoding an error correction code according to an embodiment of the present invention.

FIG. 2 is a work flowchart illustrating a method for decoding an error correction code according to an embodiment of the present invention. The error correction code may comprise a set of message bits and a set of parity bits. The method show in FIG. 2 may be applied to the decoding circuit 100 shown in FIG. 1. The method 200 is described as follows.

In Step 210, the error syndrome calculation module 110 calculates a set of error syndromes of the error correction code, such as s error syndromes, wherein the error correction code is a t-error correction code and has capability of correcting t errors, and s is smaller than t. More particularly, the error syndrome calculation units 110-1, 110-2, ..., and 110-s in the error syndrome calculation module 110 may calculate the s error syndromes, respectively.

In Step 220, the error locator polynomial determining module 120 refers to at least one portion (e.g. part or all) of error syndromes within the set of error syndromes, to sequentially determine a set of coefficients $\Lambda 1, \Lambda 2, \ldots,$ and $\Lambda s$ within a plurality of coefficients $\Lambda 1, \Lambda 2, \ldots,$ and $\Lambda t$ of an error locator polynomial (e.g. a polynomial $\Lambda(x)$) of the error correction code, for building a roughly-estimated error locator polynomial, wherein the number of the plurality of coefficients $\Lambda 1, \Lambda 2, \ldots,$ and $\Lambda t$ is t, and the number of the set of coefficients $\Lambda 1, \Lambda 2, \ldots,$ and $\Lambda s$ is s. In practice, the calculation order of the set of coefficients $\Lambda 1, \Lambda 2, \ldots,$ and $\Lambda s$ within the plurality of coefficients $\Lambda 1, \Lambda 2, \ldots,$ and $\Lambda t$ of the error locator polynomial is from the first-order coefficient $\Lambda 1$ to the highest-order coefficient $\Lambda s$.

In Step 230, the Chien search module 130 executes a Chien search to find the roots of the roughly-estimated error locator polynomial. More particularly, the Chien search module 130 may refer to the set of coefficients $\Lambda 1, \Lambda 2, \ldots,$ and $\Lambda s$ to build the roughly-estimated error locator polynomial, and then execute the Chien search to find the roots of the roughly-estimated error locator polynomial. For example, the roughly-estimated error locator polynomial may be built according to the following equation:

$$1+\Lambda 1 x+\Lambda 2 x 2+\ldots+\Lambda s x s;$$

According to some embodiments of the present invention, the above equation may be modified, wherein the plurality of coefficients $\Lambda 1, \Lambda 2, \ldots,$ and $\Lambda t$ and the set of coefficients $\Lambda 1, \Lambda 2, \ldots,$ and $\Lambda s$ may change.

In Step 240, the error correction module 140 refers to the roots of the roughly-estimated error locator polynomial to correct the error correction code, in order to generate a correction result of the error correction code.

In Step 250, the checking module 150 performs at least one checking operation upon the correction result, to make the decoding circuit 100 selectively utilize the correction result as a decoding result of the error correction code. More particularly, the checking module 150 performs the checking operation upon the correction result to generate at least one checking result. Under the control of the control module 105, the decoding circuit 100 refers to the checking result of the checking operation to selectively utilize the correction result as the decoding result of the error correction code.

Note that FIG. 2 shows a work flow including Steps 210-250. This is merely for illustrative purposes, and not meant to be a limitation of the present invention. According to a modification of this embodiment, the work flow may be adjusted. For example, at least one portion of operation within the operations in Steps 210-250 may be repeatedly executed. In another example, at least one portion of operations in Steps 210-250 may be executed, concurrently.

According to this embodiment, the control module 105 may selectively control the number of enabled error syndrome calculation units within the t error syndrome calculation units 110-1, 110-2, ..., and 110-t, and may selectively control the times of the error locator polynomial determining module 120 executing the error correction code in the corresponding work flow. As long as the number of the error syndrome calculation units 110-1, 110-2, ..., and 110-s is smaller than the number of the error syndrome calculation units 110-1, 110-2, ..., and 110-t (i.e. s<t), and the times of the error locator polynomial determining module 120 executing the error correction code in the corresponding work flow is smaller than the aforementioned upper limit t, the control module 105 may control the error syndrome calculation module 110 to save power, and may control the error locator polynomial determining module 120 to reduce the processing time. Therefore, the decoding circuit 100 which adopts the method 200 may achieve the goals of saving time and power, and the overall efficiency of the electronic device (especially the electronic device comprising the decoding circuit 100) which adopts the method 200 may be thus improved.

In practice, the error correction code may be a BCH code. According to other embodiments of the present invention, the error correction code may be a RS code.

As shown in the scheme of FIG. 1, the checking module 150 and the control module 105 are depicted in two separate modules. According to some embodiments of the present invention, however, the checking module 150 and the control module 105 may be integrated into the same module, such as a control and checking module. Hence, in Step 250, the control and checking module may perform the checking operation upon the correction result, in order to make the decoding circuit 100 selectively utilize the correction result as a decoding result of the error correction code.

According to some embodiments of the present invention, under the control of the control module 105, when the checking result of the checking operation indicates that the correction result is correct, the decoding circuit 100 utilizes the correction result as the decoding result of the error correction code. More specifically, under the control of the control module 105, when the checking result of the at least one checking operation indicates that the correction result is correct, the decoding circuit 100 utilizes the correction result as the decoding result of the error correction code; otherwise, the decoding circuit 100 prevents from utilizing the correction result as the decoding result of the error correction code. For example, under the situation where the checking result of the checking operation indicates that the correction result is not correct, the decoding circuit 100 may decode the error correction code one more time under the control of the control module 105.

According to some embodiments of the present invention, the checking operation may comprise a post check operation, and/or a cyclic redundancy check (CRC) operation. For example, the checking operation may comprise the post checking operation. In another example, the checking operation may comprise the CRC checking operation. In another example, the checking operation may comprise both the post checking operation and the CRC checking operation.

More particularly, under the situation where the checking operation comprises the post checking operation, the checking module 150 may refer to the correction result to calculate one or more error syndromes corresponding to the correction result, in order to detect whether all error syndromes corresponding to the correction result are equal to zero. Further, under the control of the control module 105, the decoding circuit 100 may refer to whether all error syndromes corresponding to the correction result are equal to zero, to selectively utilize the correction result of the error correction code as the decoding result of the error correction code. For example, under the control of the control module 105, when all error syndromes corresponding to the correction result are equal to zero, the decoding circuit 100 utilizes the correction result of the error correction code as the decoding result of the error correction code. In another example, under the control of the control module 105, when not all of the error syndromes corresponding to the correction result are equal to zero, the decoding circuit 100 prevents from utilizing the correction result of the error correction code as the decoding result of the error correction code. In practice, when it is detected that there is at least one error syndrome within the one or more error syndromes corresponding to the correction result which is not equal to zero (which means that the correction result is incorrect), the decoding circuit 100 may decode the error correction code one more time under the control of the control module 105.

According to some embodiments of the present invention, under the control of the control module 105, when the checking result of the checking operation indicates that the correction result is incorrect, the error syndrome calculation module 110 calculates at least one other error syndrome of the error correction code to generate another set of error syndromes for building the error locator polynomial, and accordingly generates another correction result of the error correction code, wherein the other set of error syndromes comprises the set of error syndromes and the error syndrome, and the number of the other set of error syndromes is equal to t. More particularly, under the control of the control module 105, the error locator polynomial determining module 120 may refer to at least one portion (e.g. part or all) of error syndromes within the other set of error syndromes to sequentially determine at least one other coefficient within the plurality of coefficients $\Lambda_1, \Lambda_2, \ldots,$ and $\Lambda$ of the error locator polynomial of the error correction code, to build the error locator polynomial. For example, the coefficient may comprise (t−s) coefficients $\Lambda_{s+1}, \Lambda_{s+2}, \ldots,$ and $\Lambda_t$ within the plurality of coefficients $\Lambda_1, \Lambda_2, \ldots,$ and $\Lambda_t$. In another example, in the situation where the number s of the set of error syndromes mentioned in Step 210 is set as (t−1), the coefficient within the plurality of coefficients $\Lambda_1$, $\Lambda_2$, ..., and $\Lambda_t$ may comprise the coefficient $\Lambda_t$.

In practice, the order of calculating the plurality of coefficients $\Lambda_1$, $\Lambda_2$, ..., and $\Lambda_t$ of the error locator polynomial starts from the first-order coefficient $\Lambda_1$ to the highest-order coefficient $\Lambda_t$. As long as the set of coefficients $\Lambda_1$, $\Lambda_2$, ..., and $\Lambda_s$ is stored in advance, the error locator polynomial determining module 120 may directly obtain the set of coefficients $\Lambda_1$, $\Lambda_2$, ..., and $\Lambda_s$, to calculate the other coefficient, such as the (t−s) coefficients $\Lambda_{s+1}$, $\Lambda_{s+2}$, ..., and $\Lambda_t$, wherein the (t−s) coefficients $\Lambda_{s+1}$, $\Lambda_{s+2}$, ..., and $\Lambda_t$ are calculated from the (s+1)th-order coefficient $\Lambda_{s+1}$ to the highest-order coefficient $\Lambda_t$.

No matter the number of the other coefficient within the plurality of coefficients $\Lambda_1$, $\Lambda_2$, ..., and $\Lambda_t$, the Chien search module 130 may execute the Chien search to find the roots of the error locator polynomial (e.g. $\Lambda$ (x)), and the error correction module 140 may refer to the roots of the error locator polynomial to correct the error correction code for generating the other correction result of the error correction code. More particularly, the Chien search module 130 may refer to the plurality of coefficients $\Lambda_1$, $\Lambda_2$, ..., and $\Lambda_t$ to build the error locator polynomial, and execute the Chien search to find the roots of the error locator polynomial. For example, the error locator polynomial may be built according to the following equation:

$$1+\Lambda_1 x+\Lambda_2 x^2+\ldots+\Lambda_t x^t;$$

According to some embodiments of the present invention, the equation may be modified, i.e. the plurality of coefficients $\Lambda_1$, $\Lambda_2$, ..., and $\Lambda_t$ may be changed.

According to some embodiments of the present invention, the error correction code may comprise a set of message bits as mentioned above, and may further comprise a set of parity bits as mentioned above. The decoding circuit 100 may encode the set of message bits to generate a set of encoded bits. Further, the decoding circuit 100 may perform bitwise exclusive OR (bitwise XOR) operations upon the set of encoded bits and the set of parity bits to generate a set of parity mismatch bits, wherein the set of parity mismatch bits may be also called "disparity". The error syndrome calculation module 110 may refer to the set of parity mismatch bits to perform a conversion operation for generating the set of error syndromes.

Figure 3:
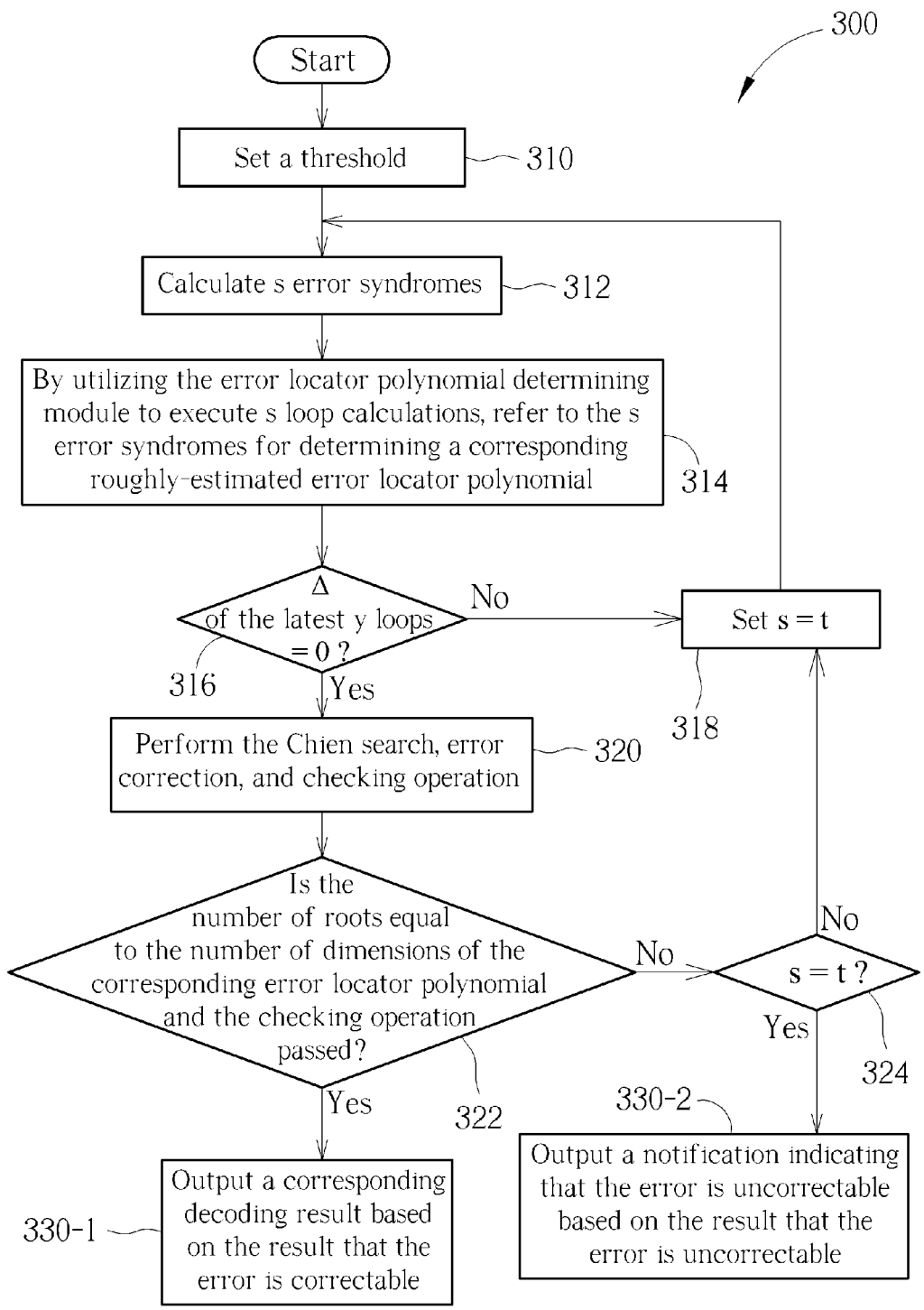
FIG. 3 is a work flow of the method shown in FIG. 2 according to an embodiment of the present invention.

FIG. 3 is a work flow of the method 200 shown in FIG. 2 according to an embodiment of the present invention. In step 310, the control module 105 sets a threshold s, and more particularly, sets the threshold s for the error syndrome calculation module 110 and the error locator polynomial determining module 120. The threshold s may be used as the number s of the error syndrome calculation units 110-1, 110-2, ..., and 110-s mentioned in the embodiment of FIG. 1. In another example, the threshold s may be used as the execution times of the error locator polynomial determining module 120 (mentioned in the embodiment of FIG. 1) on the error correction code in the corresponding work flow. Typically, the initial value of the threshold s mentioned in Step 310 is set to be smaller than t in the work flow 300.

In Step 312, the error syndrome calculation module 110 (especially the error syndrome calculation units 110-1, 110-2, ..., and 110-s therein) calculates s error syndromes. For example, if s<t, the s error syndromes mentioned in Step 312 may be s error syndromes as mentioned in Step 210. If s=t, the s error syndromes mentioned in Step 312 may be the other set of error syndromes as mentioned above.

In Step 314, by utilizing the error locator polynomial determining module 120 to execute s loop calculations, the decoding circuit 100 (especially the error locator polynomial determining module 120 and Chien search module 130 therein) refers to the s error syndromes for determining a corresponding error locator polynomial. For example, if s<t, the corresponding error locator polynomial may represent the roughly-estimated error locator polynomial mentioned in Step 220, wherein the operations in Step 314 may comprise the operations in Step 220, and the Chien search module 130 may build the roughly-estimated error locator polynomial. In another example, if s=t, the corresponding error locator polynomial may represent the roughly-estimated error locator polynomial mentioned in Step 220, wherein the error locator polynomial determining module 120 may refer to the portion (e.g. part or all) of error syndromes within the other set of error syndromes. The coefficient within the plurality of coefficients $\Lambda_1$, $\Lambda_2$, ..., and $\Lambda_t$ of the error locator polynomial of the error correction code can thereby be sequentially determined for the Chien search module 130 to build the error locator polynomial (e.g. $\Lambda$ (x)).

In Step 316, the control module 105 performs a checking operation based on a safety index y, to confirm whether the safety index y is passed. More particularly, the control module 105 may check whether the discrepancy $\Delta$ of the latest y loops is equal to zero or not (as shown in FIG. 3, "$\Delta$ of the latest y loops=0?", for brevity). The control module 105 may check whether the discrepancy $\Delta$ of each of the latest successive y loops is equal to zero. If the discrepancy $\Delta$ of each of the latest successive y loops is equal to zero, the control module 105 determines that the safety index y is passed. Otherwise (i.e. the discrepancy $\Delta$ of each of the latest successive y loops is not equal to zero), the control module 105 determines that the safety index y is not passed. When the control module 105 determines that the safety index y is passed, the flow proceeds to Step 320; otherwise, the flow proceeds to Step 318.

In Step 318, the control module 105 sets s=t, in order to perform decoding again.

In Step 320, the decoding circuit 100 (especially the Chien search module 130, the error correction module 140 and the checking module 150 therein) performs the Chien search, error correction, and checking operation. If s<t, operations of Step 320 may comprise the operations of Steps 230, 240 and 250. If s=t, operations of Step 320 may comprise: using the Chien search module 130 to execute the Chien search to find the roots of the roughly-estimated error locator polynomial (e.g. $\Lambda$ (x)); the error correction module 140 refers to the roots of the roughly-estimated error locator polynomial to correct the error correction code, in order to generate the other correction result of the error correction code; and the checking module 150 performs the checking operation upon the other correction result to generate a corresponding checking result for determining whether the checking operation is passed.

In Step 322, the control module 105 checks whether the number of roots (obtained in Step 320) is equal to the number of dimensions of the corresponding error locator polynomial (which is mentioned in Step 314), to determine whether the error is correctable. In the situation where s<t, the control module 105 checks whether the number of roots of the roughly-estimated error locator polynomial is equal to the number of dimensions of the roughly-estimated error locator polynomial, and whether the correction result (e.g. the correction result mentioned in Step 240) has been obtained in Step 320 has passed the checking operation in order to determine whether the error is correctable. In another example, in the situation where s=t, the control module 105 checks whether the number of roots of the error locator polynomial is equal to the number of dimensions of the error locator polynomial and whether the other correction result obtained in Step 320 has passed the checking operation, in order to determine whether the error is correctable or not. When it is detected that the number of roots is equal to the number of dimensions of the corresponding error locator polynomial and the checking operation is passed (i.e. the error is determined as correctable), the flow proceeds to Step 330-1; otherwise, the flow proceeds to Step 330-2, in order to perform a further determination operation.

In Step 324, the control module 105 checks whether s=t, to determine whether the error is uncorrectable. When it is detected that s=t (i.e., the error is determined as uncorrectable), the flow proceeds to Step 330-2; otherwise, the flow proceeds to Step 318.

In Step 330-1, the control module 105 outputs a corresponding decoding result based on the result that the error is correctable. For example, when s<t, the control module 105 controls the decoding circuit 100 to output the correction result (e.g. the correction result mentioned in Step 250) as the decoding result of the error correction code. In another example, when s=t, the control module 105 controls the decoding circuit 100 to output the other correction result as the decoding result of the error correction code.

In Step 330-2, based on the result that the error is uncorrectable, the control module 105 outputs a notification indicating that the error is uncorrectable.

In practice, the methods for calculating the discrepancy Δ mentioned in Step 316 can be those used in related art methods, such as those associated with BCH encoding/decoding. A detailed description of calculating the discrepancy is omitted here for brevity.

In the work flow 300, the step of checking whether all error syndromes within the s error syndromes mentioned in Step 312 are equal to zero is not depicted between Step 312 and Step 314. According to some embodiments of the present invention, however, the work flow 300 shown in FIG. 3 may be modified. For example, the checking step may be added between Step 312 and Step 314, to determine whether all of the s error syndromes mentioned in Step 312 are equal to zero. More specifically, in the embodiments of the present invention, when detecting whether all of the s error syndromes mentioned in Step 312 are equal to zero, at least one follow-up step may be omitted.

Figure 4:
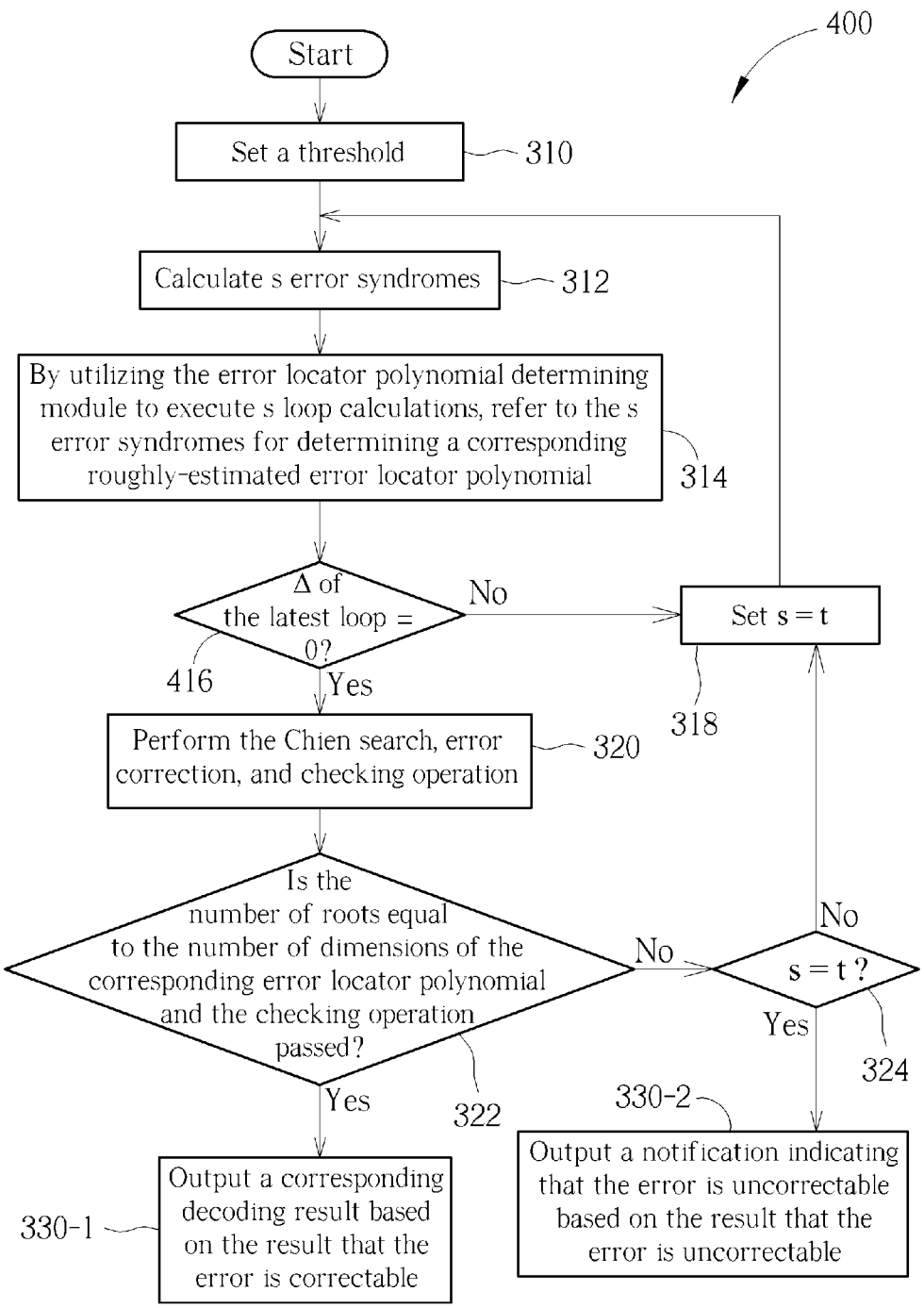
FIG. 4 is a work flow of the method shown in FIG. 2 according to another embodiment of the present invention.

FIG. 4 is a work flow 400 of the method 200 shown in FIG. 2 according to another embodiment of the present invention. As shown in FIG. 4, most steps of the work flow 400 are similar to those of the work flow 300 shown in FIG. 3, but Step 316 is replaced with Step 416 in the embodiment of FIG. 4. The steps in FIG. 4 other than Step 416 are those illustrated in FIG. 3, and are therefore omitted here for brevity.

In Step 416, the control module 105 performs a checking operation based on the safety index y. More particularly, when y=1, the control module 105 may check whether the discrepancy Δ of each of the latest a loops is equal to zero (illustrated by "Δ of the latest loop=0?" in FIG. 4). If the discrepancies Δ of the latest a loops are all equal to zero, the control module 105 determines the checking operation based on the result that the safety index y is passed; otherwise, the control module 105 determines the checking operation based on the result that the safety index y is not passed. If the control module 105 determines the checking operation based on the result that the safety index y is passed, the flow proceeds to Step 320; otherwise, the flow proceeds to Step 318. Compared with the work flow 300 shown in FIG. 3, the work flow 400 may further save power and time.

According to some embodiments of the present invention, in a system having the decoding circuit 100, the value of the safety index y may be decided based on the strength of protecting data provided by encodings of the system, e.g. the ratio of the set of parity bits to the set of message bits. For example, when the intensity of protecting data provided by encodings of the system is weaker, the value of the safety index y will be set to be larger. When the intensity of protecting data provided by encodings of the system is stronger, the value of the safety index y can be set to be smaller.

Figure 5:
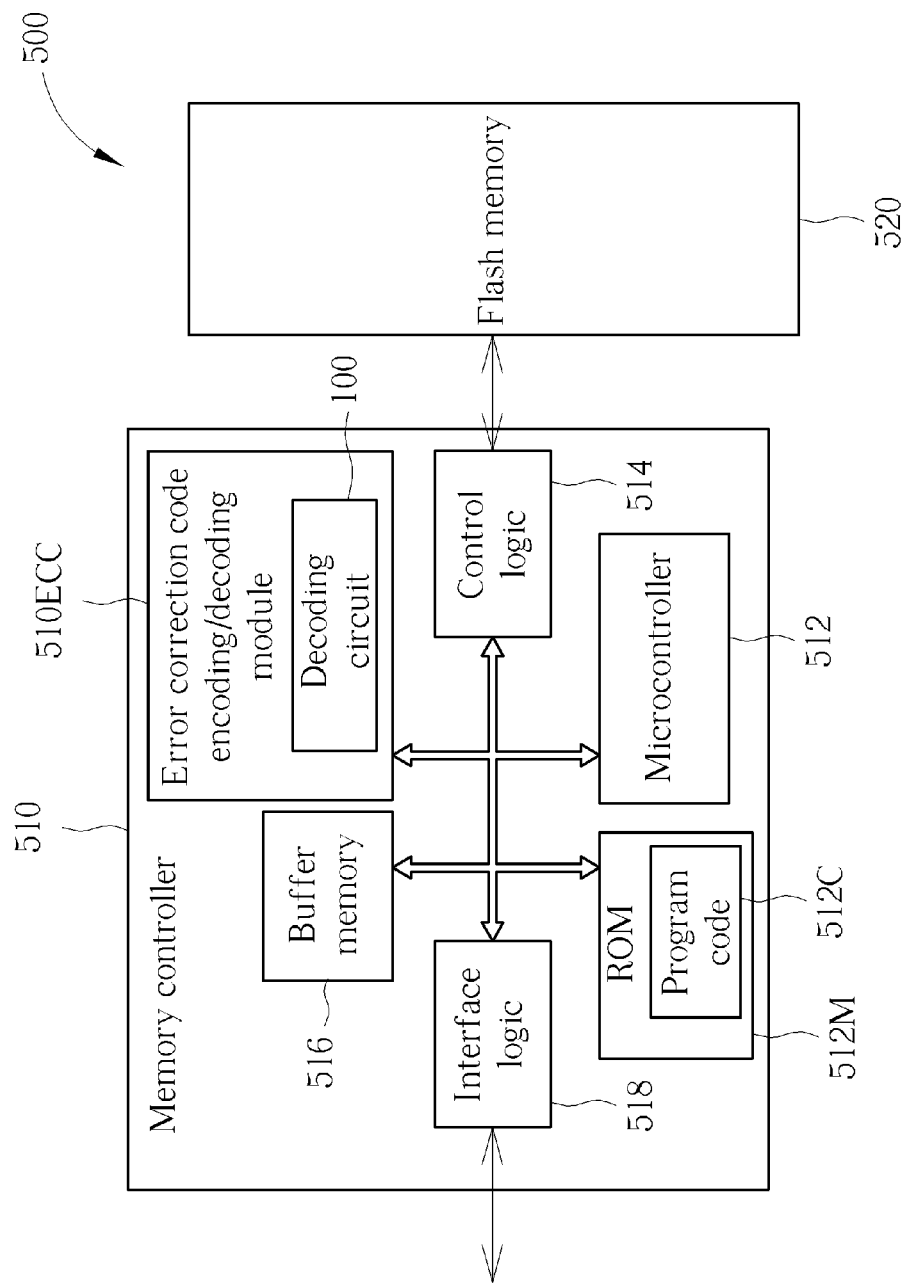
FIG. 5 is a diagram illustrating a storage device comprising the decoding circuit shown in FIG. 1 according to an embodiment of the present invention.

FIG. 5 is a diagram illustrating a storage device 500 comprising the decoding circuit 100 shown in FIG. 1 according to an embodiment of the present invention, wherein the method 200 shown in FIG. 2 may be applied to the storage device 500 shown in FIG. 5 (especially the decoding circuit 100 therein). For better understanding, the storage device 500 may be a portable memory device (e.g. a memory card conforming to the SD/MMC, CF, MS and XD specifications) in this embodiment. According to some modifications of this embodiment, the storage device 500 may be another type of memory device, such as a solid state drive (SSD).

As shown in FIG. 5, the storage device 500 comprise a flash memory 520, and a controller for accessing the flash memory 520, wherein the controller may be a storage controller, such as a memory controller 510. According to this embodiment, the memory controller 510 comprises a microcontroller 512, a read only memory (ROM) 512M, a control logic 514, a buffer memory 516, an interface logic 518, and an error correction code encoding/decoding module 510ECC, wherein the error correction code encoding/decoding module 510ECC comprises the decoding circuit 100 shown in FIG. 1. The ROM is arranged to store a program code 512C, and the microcontroller 512 is arranged to execute the program code 512C to control access to the flash memory 520.

Typically, the flash memory 520 comprises a plurality of blocks; the smallest erase unit of the controller (e.g. the memory controller 510 executing the program code 512C by utilizing the microcontroller 512) for erasing data of the flash memory 520 may be one block. Further, a block may record a predetermined number of pages, wherein a smallest write unit of the controller (e.g. the memory controller 510 executing the program code 512C through the microcontroller 512) for writing to the flash memory 520 may be one page.

In practice, the memory controller 510 executing the program code 512C through the microcontroller 512 may utilize the inner elements thereof to perform various control operations. For example, the memory controller 510 may utilize the error correction code encoding/decoding module 510ECC to perform error correction code encoding operations upon the writing data, utilize the error correction code encoding/decoding module 510ECC (especially the decoding circuit 100 therein) to perform error correction code decoding operations upon the reading data, utilize the control logic 514 to control access operations of the flash memory 520 (especially the access operation upon at least one block or at least one page), utilize the buffer memory 516 to perform buffering operations, and utilize the interface logic 518 to communicate with a host device. Some features in this embodiment which are similar to those in the above embodiments/modifications have been omitted here for brevity.

In the scheme of FIG. 5, the storage device 500 comprises the flash memory 520. According to some modifications of this embodiment, the storage device 500 may be another type of storage device, wherein the storage device 500 may comprise other types of storage mediums, and the controller may access these other types of storage mediums. Some features in this embodiment which are similar to those in the above embodiments/modifications have been omitted here for brevity.

According to some modifications of this embodiment, the storage device 500 may be installed in an electronic device. In this way, just like the decoding circuit 100, the electronic device may also achieve the goals of saving time and power. Hence, the overall efficiency of the electronic device implemented with the method 200 will be higher when compared with the related arts.

According to some modifications of this embodiment, the decoding circuit 100 may be installed in a controller of an electronic device. In this way, just like the decoding circuit 100, the electronic device may also achieve the goals of saving time and power. Hence, the overall efficiency of the electronic device implemented with the method 200 will be higher when compared with the related arts.

Figure 6:
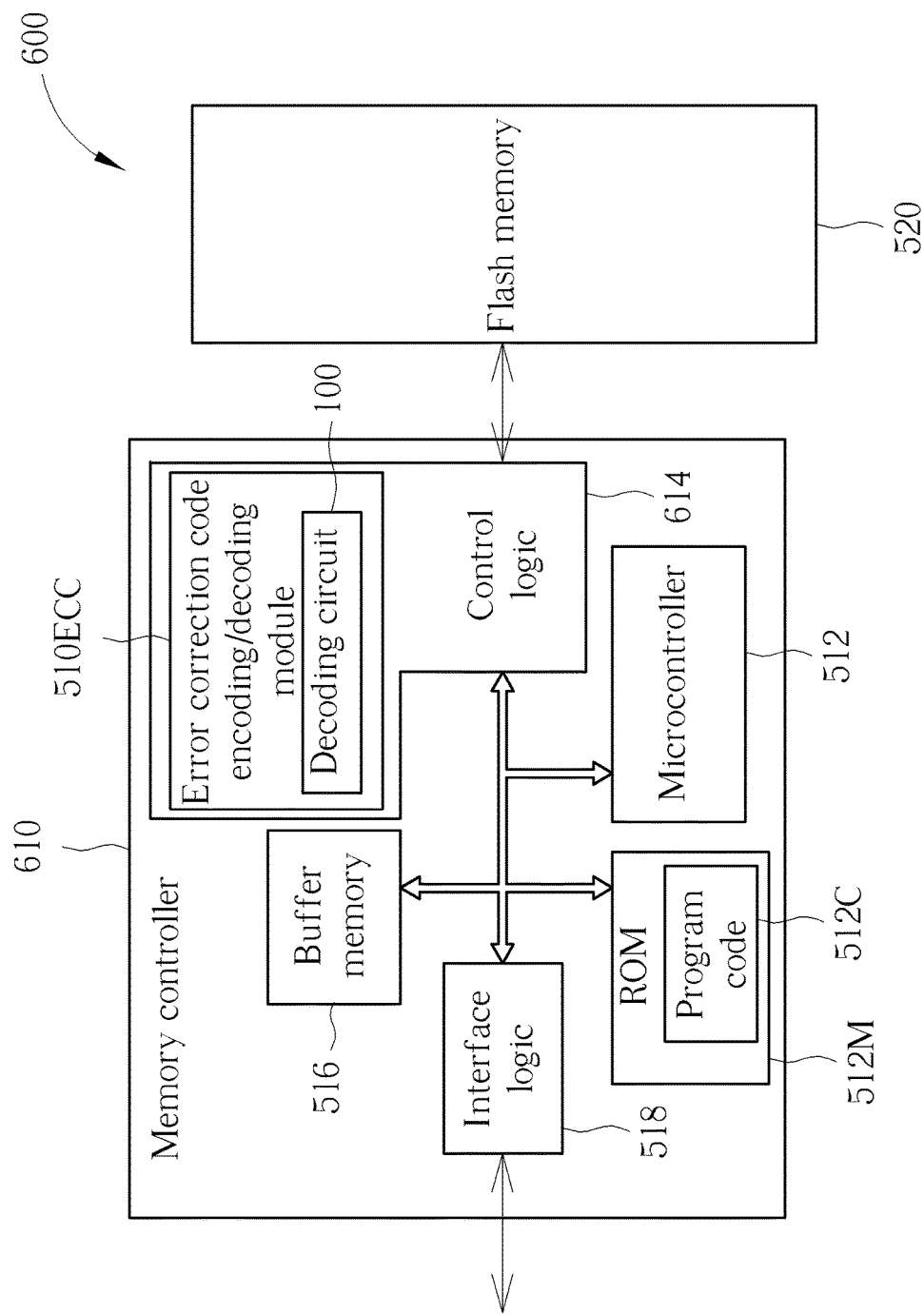
FIG. 6 is a diagram illustrating a storage device comprising the decoding circuit shown in FIG. 1 according to another embodiment of the present invention.

FIG. 6 is a diagram illustrating a storage device 600 comprising the decoding circuit 100 shown in FIG. 1 according to another embodiment of the present invention, wherein the method 200 shown in FIG. 2 may be applied to the storage device 600 shown in FIG. 6 (especially the decoding circuit 100 therein). For better understanding, the storage device 600 may be a portable memory device (e.g. a memory card conforming to SD/MMC, CF, MS or XD specification) in this embodiment. According to some modifications of this embodiment, the storage device 600 may be another type of memory device, such as an SSD.

As shown in FIG. 6, the error correction code encoding/decoding module 510ECC (especially the decoding circuit 100 therein) and the control logic 514 are integrated into one module in this embodiment, i.e. the control logic 614. In response to the change in the structure, the controller may be called the memory controller 610 in this embodiment. Some features in this embodiment which are similar to those in the above embodiments/modifications have been omitted here for brevity.

According to some modifications of this embodiment, the storage device 600 may be installed in a controller of an electronic device. In this way, just like the decoding circuit 100, the electronic device may achieve the goals of saving time and power. Hence, the overall efficiency of the electronic device implemented with the method 200 will be higher when compared with the related arts.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling a storage device with aid of error correction, the method being applied to a storage controller of the storage device, the storage device comprising the storage controller and a storage medium, the method comprising:

controlling operations of the storage device to access the storage medium for an electronic device where the storage device is installed; and when accessing the storage medium for the electronic device, utilizing an error correction code processing module within the storage controller to perform error correction code decoding operations upon reading data from the storage medium;

by utilizing an error syndrome calculation module within a decoding circuit positioned in the error correction code processing module, calculating a set of error syndromes of an error correction code, wherein the error correction code is a t-error correcting code and has capability of correcting t errors, and a number s of the set of error syndromes is smaller than t;

by utilizing an error locator polynomial determining module within the decoding circuit, sequentially determining a set of coefficients within a plurality of coefficients of an error locator polynomial of the error correction code according to at least one portion of error syndromes within the set of error syndromes, for building a roughly-estimated error locator polynomial, wherein a number of the plurality of coefficients is equal to t, and a number of the set of coefficients is equal to s;

by utilizing a Chien search module within the decoding circuit, performing a Chien search to determine a plurality of roots of the roughly-estimated error locator polynomial;

by utilizing an error correction module within the decoding circuit, correcting the error correction code according to the roots of the roughly-estimated error locator polynomial, to generate a correction result of the error correction code; and by utilizing a checking module within the decoding circuit, performing at least one checking operation to selectively utilize the correction result as a decoding result of the error correction code, as an option of generating the decoding result of the error correction code, thereby the storage controller saves time and power for the electronic device;

wherein it is true that the option of generating the decoding result of the error correction code is selected.

2. The method of claim 1, wherein the step of performing the at least one checking operation to selectively utilize the correction result as the decoding result of the error correction code further comprises:

when at least one checking result of the at least one checking operation indicates that the correction result is correct, utilizing the correction result as the decoding result of the error correction code.

3. The method of claim 2, wherein the step of performing the at least one checking operation to selectively utilize the correction result as the decoding result of the error correction code further comprises:

when the at least one checking result of the at least one checking operation indicates that the correction result is correct, utilizing the correction result as the decoding result of the error correction code; otherwise, preventing from utilizing the correction result as the decoding result of the error correction code.

4. The method of claim 1, wherein the at least one checking operation comprises a post check operation; and the step of performing the at least one checking operation to selectively utilize the correction result as the decoding result of the error correction code further comprises:

calculating one or more error syndromes corresponding to the correction result according to the correction result, to detect whether all error syndromes corresponding to the correction result are equal to zero; and according to whether all error syndromes corresponding to the correction result are equal to zero, selectively utilizing the correction result as the decoding result of the error correction code.

5. The method of claim 4, wherein the at least one checking operation further comprises a cyclic redundancy check (CRC) operation.

6. The method of claim 1, wherein the at least one checking operation comprise a cyclic redundancy check (CRC) operation.

7. The method of claim 1, wherein the method further comprises:
when at least one checking result of the at least one checking operation indicates that the correction result is incorrect, calculating at least one other error syndrome of the error correction code to generate another set of error syndromes, for building the error locator polynomial and accordingly generating another correction result of the error correction code, wherein the another set of error syndromes comprises the set of error syndromes and at least the other error syndrome, and the number of the another set of error syndromes is equal to t.

8. The method of claim 7, wherein the method further comprises:
according to at least one portion of error syndrome within the another set of error syndromes, sequentially determining at least one other coefficient within the plurality of coefficients of the error locator polynomial of the error correction code, for building the error locator polynomial.

9. The method of claim 8, wherein the method further comprises:
executing the Chien search to find roots of the error locator polynomial; and
correcting the error correction code according to the roots of the error locator polynomial, to generate the other correction result of the error correction code.

10. The method of claim 1, wherein the error correction code comprises a set of message bits and a set of parity bits; and the method further comprises:
encoding the set of message bits to generate a set of encoded bits;
performing a bitwise exclusive OR (bitwise XOR) operation upon the set of encoded bits and the set of parity bits to generate a set of parity mismatch bits; and
performing a converting operation according to the set of parity mismatch bits to generate the set of error syndromes.

11. A storage device, comprising:
a storage medium; and
a storage controller, arranged to control operations of the storage device to access the storage medium for an electronic device, wherein the storage controller comprises:
an error correction code processing module, arranged to perform error correction code decoding operations upon reading data from the storage medium when the storage controller accesses the storage medium for the electronic device, wherein the error correction code processing module comprises:
a decoding circuit comprising:
an error syndrome calculation module, arranged to calculate a set of error syndromes of an error correction code, wherein the error correction code is a t-error correction code and has capability of correcting t errors, and a number s of the set of error syndromes is smaller than t;
an error locator polynomial determining module, arranged to refer to at least one portion of error syndromes within the set of error syndromes, to sequentially determine a set of coefficients within a plurality of coefficients in an error locator polynomial of the error correction code, to build a roughly-estimated error locator polynomial, wherein a number of the plurality of coefficients is equal to t, and a number of the set of coefficients is equal to s;
a Chien search module, arranged to execute a Chien search to find a plurality of roots of the roughly-estimated error locator polynomial;
an error correction module, arranged to refer to the roots of the roughly-estimated error locator polynomial to correct the error correction code in order to generate a correction result of the error correction code;
a checking module, arranged to perform at least one checking operation upon the correction result of the error correction code to generate at least one checking result; and
a control module, arranged to control operations of the decoding circuit, wherein under the control of the control module, the decoding circuit refers to the at least one checking result of the at least one checking operation to selectively utilize the correction result as a decoding result of the error correction code, as an option of generating the decoding result of the error correction code, thereby the storage controller saves time and power;
wherein it is true that the option of generating the decoding result of the error correction code is selected.

12. The storage device of claim 11, wherein under the control of the control module, when the at least one checking result of the at least one checking operation indicates that the correction result is correct, the decoding circuit utilizes the correction result as the decoding result of the error correction code.

13. The storage device of claim 12, wherein under the control of the control module, when the at least one checking result of the at least one checking operation indicates that the correction result is correct, the decoding circuit utilizes the correction result as the decoding result of the error correction code; otherwise, the decoding circuit prevents from utilizing the correction result as the decoding result of the error correction code.

14. The storage device of claim 11, wherein the at least one checking operation comprises a post check operation; the checking module refers to the correction result to calculate one or more error syndromes corresponding to the correction result to detect whether all error syndromes corresponding to the correction result are equal to zero; and under the control of the control module, the decoding circuit refers to whether all error syndromes corresponding to the correction result are equal to zero to selectively utilize the correction result of the error correction code as the decoding result of the error correction code.

15. The storage device of claim 14, wherein the at least one checking operation further comprises a cyclic redundancy check (CRC) operation.

16. The storage device of claim 11, wherein the at least one checking operation comprises a cyclic redundancy check (CRC) operation.

17. The storage device of claim 11, wherein under the control of the control module, when the at least one checking result of the at least one checking operation indicates that the correction result is incorrect, the error syndrome calculation module calculates at least one other error syndrome of the error correction code to generate another set of error syndromes to build the error locator polynomial and accordingly generate another correction result of the error correction code, wherein the another set of error syndromes comprises the set of error syndromes and at least the other error syndrome, and the number s of the another set of error syndromes is equal to t.

18. The storage device of claim 17, wherein under the control of the control module, the error locator polynomial determining module refers to at least one portion of error syndrome within the another set of error syndromes to sequentially determine at least one other coefficient within the plurality of coefficients of the error locator polynomial of the error correction code in order to build the error locator polynomial.

19. The storage device of claim 18, wherein the Chien search module executes the Chien search to find roots of the error locator polynomial; and the error correction module refers to the roots of the error locator polynomial to correct the error correction code to generate the other correction result of the error correction code.

20. The storage device of claim 11, wherein the error correction code comprises a set of message bits and a set of parity bits; the decoding circuit encodes the set of message bits to generate a set of encoded bits; the decoding circuit performs bitwise exclusive OR (bitwise XOR) operations upon the set of encoded bits and the set of parity bits to generate a set of parity mismatch bits; and the error syndrome calculation module refers to the set of parity mismatch bits to perform a conversion operation to generate the set of error syndromes.

21. A storage controller of a storage device, the storage device comprising the storage controller and a storage medium, the storage controller comprising:
a microcontroller; and
an error correction code processing module, arranged to perform error correction code decoding operations upon reading data from the storage medium when the storage controller accesses the storage medium, wherein the error correction code processing module comprises:
a decoding circuit, comprising:
an error syndrome calculation module, arranged to calculate a set of error syndromes of an error correction code, wherein the error correction code is a t-error correction code and has capability of correcting t errors, and a number s of the set of error syndromes is smaller than t;
an error locator polynomial determining module, arranged to refer to at least one portion of error syndromes within the set of error syndromes, to sequentially determine a set of coefficients within a plurality of coefficients in an error locator polynomial of the error correction code, to build a roughly-estimated error locator polynomial, wherein a number of the plurality of coefficients is equal to t, and a number of the set of coefficients is equal to s;
a Chien search module, arranged to execute a Chien search to find a plurality of roots of the roughly-estimated error locator polynomial;
an error correction module, arranged to refer to the roots of the roughly-estimated error locator polynomial to correct the error correction code in order to generate a correction result of the error correction code;
a checking module, arranged to perform at least one checking operation upon the correction result of the error correction code to generate at least one checking result; and
a control module, arranged to control operations of the decoding circuit, wherein under the control of the control module, the decoding circuit refers to the at least one checking result of the at least one checking operation to selectively utilize the correction result as a decoding result of the error correction code, as an option of generating the decoding result of the error correction code, thereby the storage controller saves time and power;
wherein it is true that the option of generating the decoding result of the error correction code is selected.

22. The storage device comprising the storage controller of claim 21, wherein the storage controller is a memory controller, the storage medium is a non-volatile (NV) memory, and the storage device is a memory device.

23. An electronic device comprising the storage device of claim 22.

* * * * *